(12) United States Patent
Cheng et al.

(10) Patent No.: US 9,461,169 B2
(45) Date of Patent: Oct. 4, 2016

(54) DEVICE AND METHOD FOR FABRICATING THIN SEMICONDUCTOR CHANNEL AND BURIED STRAIN MEMORIZATION LAYER

(75) Inventors: Kangguo Cheng, Albany, NY (US); Bruce B. Doris, Albany, NY (US); Ali Khakifirooz, Albany, NY (US); Pranita Kulkarni, Albany, NY (US); Ghavam G. Shahidi, Yorktown Heights, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 321 days.

(21) Appl. No.: 12/789,792

(22) Filed: May 28, 2010

(65) Prior Publication Data

US 2011/0291100 A1 Dec. 1, 2011

(51) Int. Cl.
| | | |
|---|---|---|
| H01L 21/00 | (2006.01) | |
| H01L 21/84 | (2006.01) | |
| H01L 29/78 | (2006.01) | |
| H01L 21/02 | (2006.01) | |
| H01L 21/265 | (2006.01) | |

(52) U.S. Cl.
CPC ....... *H01L 29/7847* (2013.01); *H01L 29/7841* (2013.01); *H01L 21/02532* (2013.01); *H01L 21/02664* (2013.01); *H01L 21/26506* (2013.01); *H01L 29/785* (2013.01)

(58) Field of Classification Search
CPC ............... H01L 29/66757; H01L 27/1214
USPC ......... 257/288, 369, 412, E21.197; 438/199, 438/230, 232, 162, 166
See application file for complete search history.

(56) References Cited

U.S. PATENT DOCUMENTS

| | | | |
|---|---|---|---|
| 4,869,781 A * | 9/1989 | Euen .................... H01L 21/0337 257/403 |
| 5,461,250 A * | 10/1995 | Burghartz et al. ............ 257/347 |
| 5,967,794 A | 10/1999 | Kodama |
| 6,074,920 A * | 6/2000 | Houston ........... H01L 21/28052 257/E21.199 |
| 6,087,235 A | 7/2000 | Yu |
| 6,121,659 A * | 9/2000 | Christensen ........ H01L 27/1203 257/347 |
| 7,195,961 B2 * | 3/2007 | Richter ............... H01L 27/1203 257/E21.193 |
| 7,528,056 B2 | 5/2009 | Ieong et al. |
| 7,659,213 B2 * | 2/2010 | Wei et al. ..................... 438/766 |
| 7,863,139 B2 * | 1/2011 | Atanakovic ......... H01L 29/4908 257/18 |
| 8,536,032 B2 * | 9/2013 | Cheng et al. ................. 438/522 |
| 8,685,806 B2 * | 4/2014 | Dyer ................ H01L 21/76254 257/296 |
| 2002/0063285 A1* | 5/2002 | Wu ................... H01L 27/10873 257/347 |
| 2003/0027381 A1* | 2/2003 | Buynoski et al. ............. 438/162 |
| 2004/0094758 A1* | 5/2004 | Usuda et al. .................. 257/18 |
| 2005/0059228 A1* | 3/2005 | Bu ....................... H01L 29/0847 438/595 |

(Continued)

OTHER PUBLICATIONS

A. Wei et al. "Multiple Stress Memorization in Advanced SOI CMOS Technologies", Symp. VLSI Tech, 2007, pp. 216-217.

(Continued)

*Primary Examiner* — Lex Malsawma
*Assistant Examiner* — Eric Jones
(74) *Attorney, Agent, or Firm* — Anthony Canale; Hoffman Warnick LLC

(57) ABSTRACT

A device and method for inducing stress in a semiconductor layer includes providing a substrate having a dielectric layer formed between a first semiconductor layer and a second semiconductor layer and processing the second semiconductor layer to form an amorphized material. A stress layer is deposited on the first semiconductor layer. The wafer is annealed to memorize stress in the second semiconductor layer by recrystallizing the amorphized material.

21 Claims, 9 Drawing Sheets

(56) References Cited

U.S. PATENT DOCUMENTS

| | | |
|---|---|---|
| 2005/0199958 A1* | 9/2005 | Chen et al. .................. 257/368 |
| 2005/0247926 A1* | 11/2005 | Sun et al. ...................... 257/19 |
| 2007/0034963 A1 | 2/2007 | Sudo |
| 2007/0249130 A1* | 10/2007 | Anderson ......... H01L 21/26586<br>438/301 |
| 2007/0254461 A1* | 11/2007 | Wei et al. .................... 438/514 |
| 2007/0290264 A1* | 12/2007 | Sugii et al. .................. 257/348 |
| 2008/0057665 A1* | 3/2008 | Lindsay ....................... 438/400 |
| 2008/0171423 A1* | 7/2008 | Ieong ............... H01L 21/02658<br>438/486 |
| 2008/0237723 A1 | 10/2008 | Wei et al. |
| 2009/0014755 A1 | 1/2009 | Nakao |
| 2009/0032877 A1* | 2/2009 | Visokay et al. ............. 257/368 |
| 2009/0079008 A1* | 3/2009 | Nandakumar et al. ...... 257/377 |
| 2009/0289284 A1* | 11/2009 | Goh et al. .................... 257/288 |
| 2010/0090303 A1* | 4/2010 | Takizawa .......... H01L 21/26506<br>257/432 |
| 2010/0140722 A1* | 6/2010 | Lindsay ....................... 257/412 |
| 2010/0210081 A1* | 8/2010 | Garg et al. ................... 438/199 |

OTHER PUBLICATIONS

R. A. Donaton, et al., Design and fabrication of MOSFETs with a reverse embedded SiGe (Rev. e-SiGe) structure, IEDM Tech. Dig., 2006.

K. Yako et al. "Aggressive Design of Millisecond Annealing Junctions for Near-Scaling-Limit Bulk CMOS Using Raised Source/Drain Extensions," IEDM Tech. Dig., 2008.

* cited by examiner

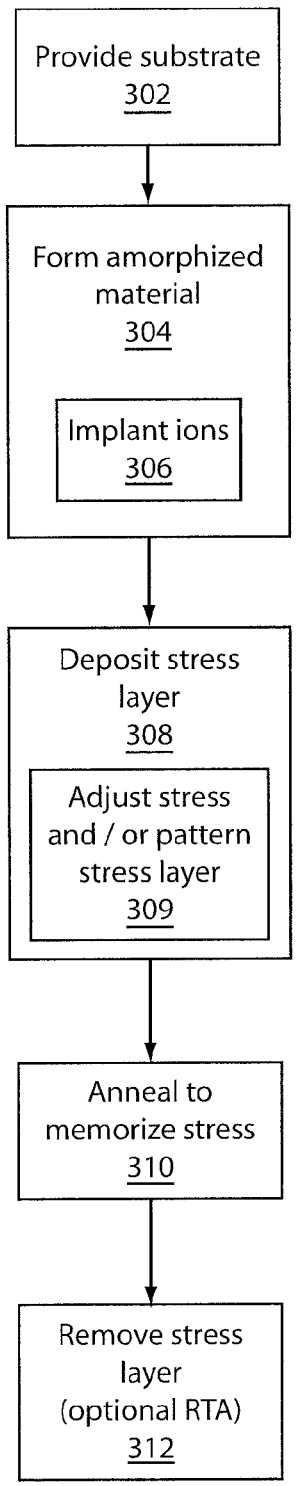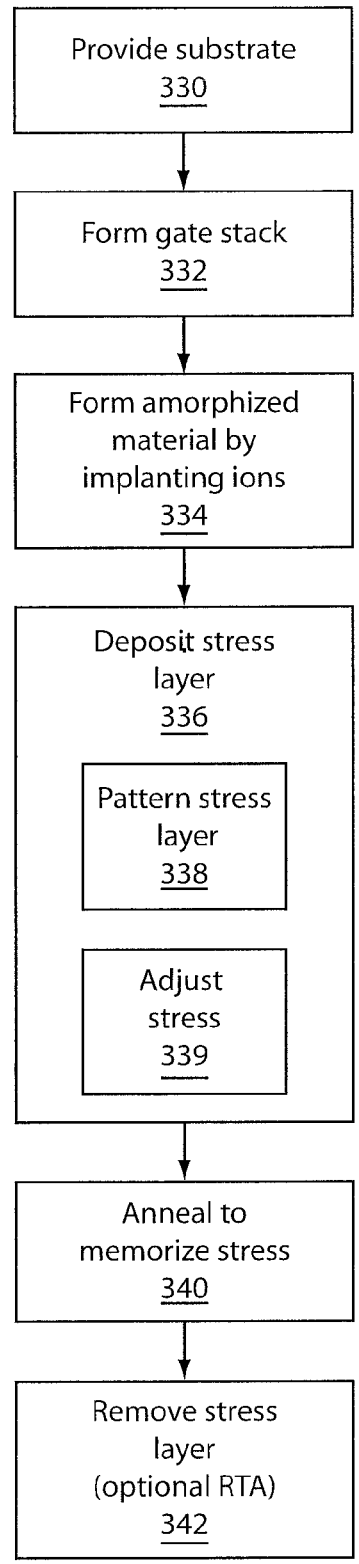
FIG. 10
FIG. 11

DEVICE AND METHOD FOR FABRICATING THIN SEMICONDUCTOR CHANNEL AND BURIED STRAIN MEMORIZATION LAYER

BACKGROUND

1. Technical Field

The present invention relates to semiconductor technology and more particularly to devices and methods for fabrication of a stressed device channel.

2. Description of the Related Art

Thin channel metal oxide semiconductor field effect transistor (MOSFET) structures such as ultrathin body semiconductor-on-insulator (SOI), FinFET, trigate, and nanowires, are considered viable options for device scaling in 22 nm node and beyond. However, most of the stress elements used in bulk technology cannot be used for thin channel devices. For example, embedded stressors such as SiGe and Si:C may not be employed for thin device channels.

One of the methods used to boost the transistor performance is the "stress memorization technique". Two mechanisms are known for this technique: (1) stress memorization in a gate electrode, and (2) stress memorization in source/drain (S/D) regions. With the advent of metal-high-k gate stacks, these approaches are not viable. Approach (1) is very difficult to implement with metal-high-k gate stacks, and approach (2) cannot be used with thin channel structures because once amorphized, the S/D region cannot be recrystallized.

SUMMARY

A device and method for inducing stress in a semiconductor layer includes providing a substrate having a dielectric layer formed between a first semiconductor layer and a second semiconductor layer and processing the second semiconductor layer to form an amorphized material. A stress layer is deposited on the first semiconductor layer. The wafer is annealed to memorize stress in the second semiconductor layer by recrystallizing the amorphized material.

A method for inducing stress in a semiconductor layer includes providing a substrate having a dielectric layer formed between a first semiconductor layer and a second semiconductor layer; forming a gate structure for a transistor device on the first semiconductor layer; implanting ions in the second semiconductor layer to form an amorphized material in areas not protected by the gate stack; depositing a stress layer on the gate structure and the first semiconductor layer; and annealing the wafer to memorize stress in the second semiconductor layer by recrystallizing the amorphized material. The methods may be combined depending on the resulting structure and stress features desired.

A semiconductor device includes a substrate having a dielectric layer formed between a first semiconductor layer and a second semiconductor layer, and a gate structure for a transistor device formed on the first semiconductor layer. A memorization layer is formed from a recrystallized material of the second semiconductor layer such that stress induced in the recrystallized material induces stress to a device channel formed below the gate structure in the first semiconductor layer. In one embodiment, the semiconductor device includes n-type and p-type polarity devices and the semiconductor device includes only one of n-type polarity devices and p-type polarity device having a stressed channel in the first semiconductor layer from the memorization layer. The semiconductor device may include n-type and p-type polarity devices, and the n-type polarity devices have a different amount of stress than the p-type polarity devices in a stressed channel in the first semiconductor layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 10 is a flow diagram showing a method for inducing a stress in a device channel using a memorized stress layer in accordance with one illustrative embodiment; and FIG. 11 is a flow diagram showing a method for inducing a stress in a device channel using a memorized stress layer in accordance with another illustrative embodiment.

DETAILED DESCRIPTION OF PREFERRED EMBODIMENTS

In accordance with the present principles, embodiments are provided which employ stress memorization with thin channel structures. These approaches rely on a thin buried insulator in a semiconductor-on-insulator (SOI) structure to memorize stress under a buried insulator and then transfer the stress to the channel. It is to be understood that the present invention will be described in terms of a given illustrative architecture having a SOI wafer; however, other architectures, structures, substrate materials and process features and steps may be varied within the scope of the present invention.

A semiconductor circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
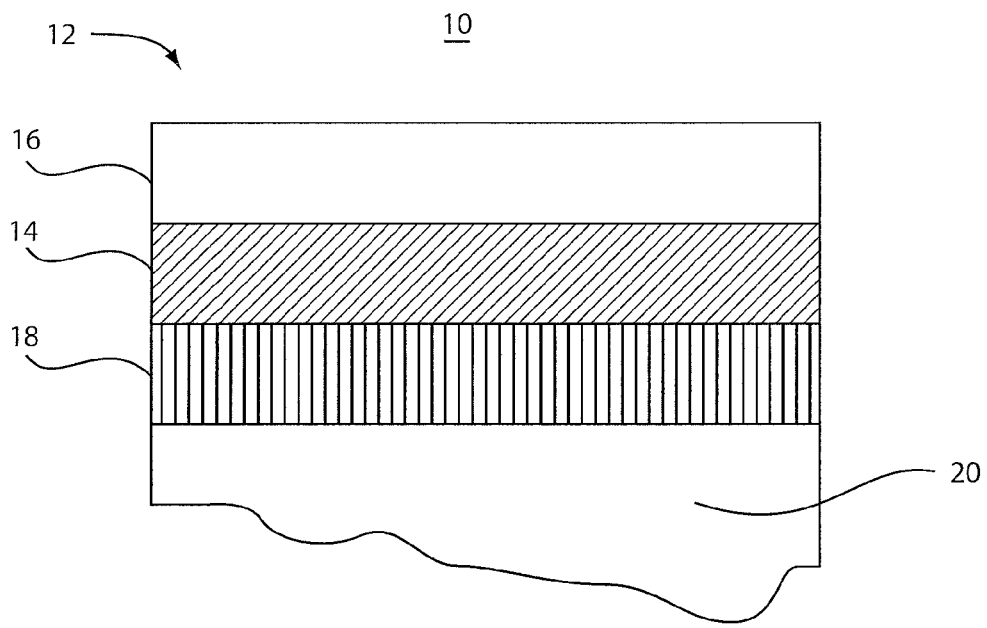
FIG. 1 is a cross-sectional view of a wafer having a thin semiconductor layer, buried dielectric layer and a buried amorphized layer in accordance with one embodiment.
Figure 2:
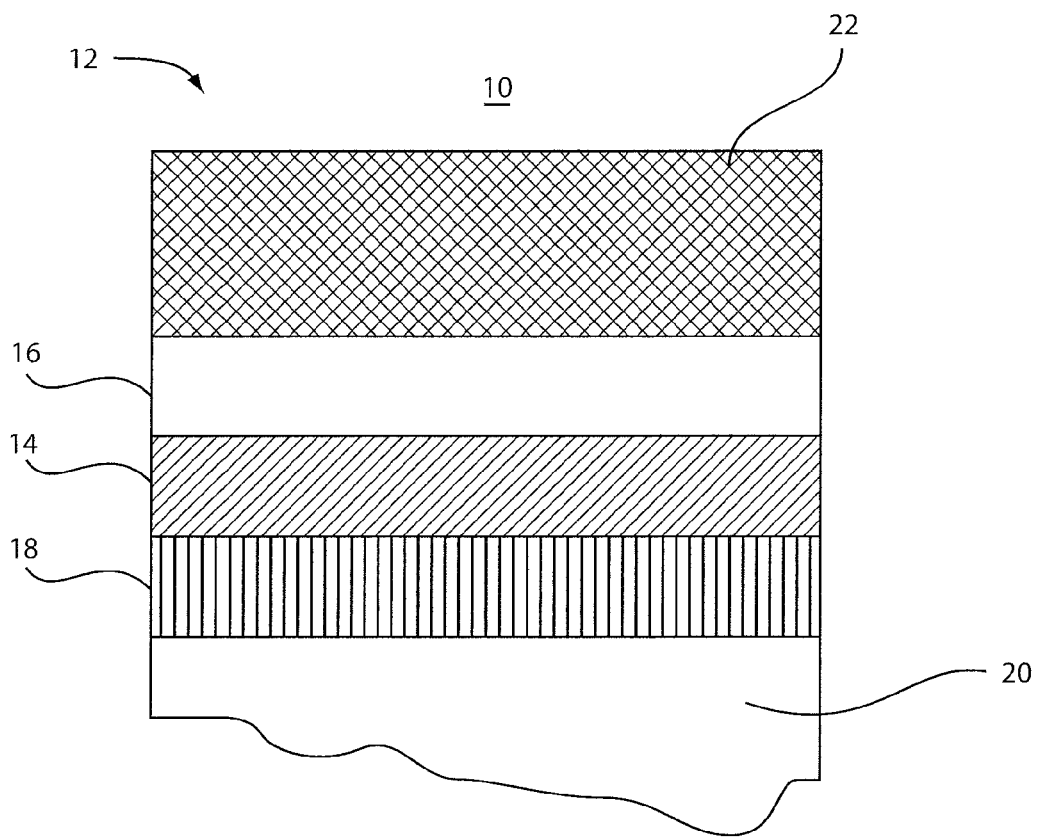
FIG. 2 is a cross-sectional view of the wafer of FIG. 1 having a stress layer or stressor formed in accordance with one embodiment.
Figure 3:
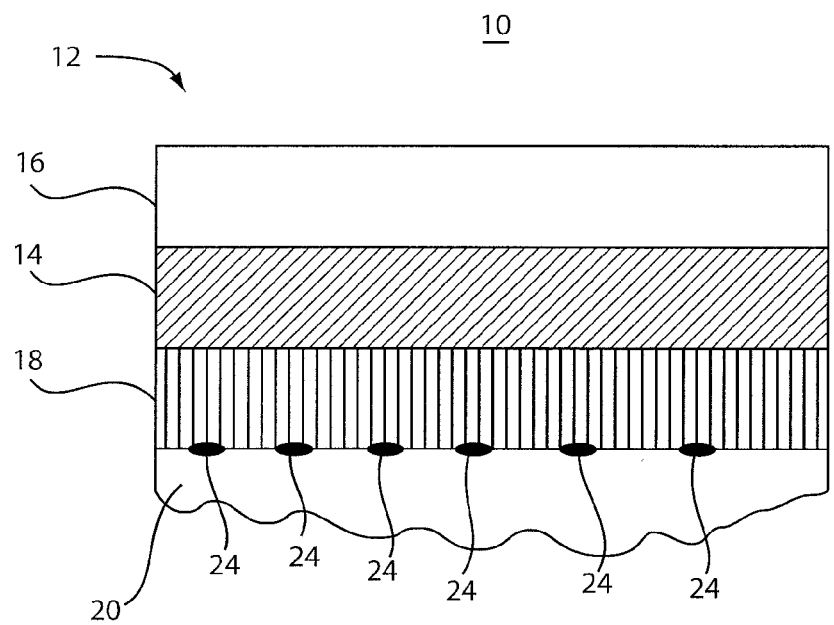
FIG. 3 is a cross-sectional view of the wafer of FIG. 2 after annealing and removing the stress layer in accordance with one embodiment.

FIGS. 1-3 show a stress memorization technique according to a first embodiment. Referring now to the drawings in which like numerals represent the same or similar elements and initially to FIG. 1, a cross-sectional view of a semiconductor device 10 includes a semiconductor-on-insulator (SOI) wafer 12. The SOT wafer 12 is preferably a thin SOT wafer with a thin buried insulator 14 (thickness of e.g., 10-50 nm) below a thin semiconductor 16 employed to form a channel layer. Another semiconductor layer 20 is provided and employed to form a buried amorphized semiconductor layer 18. A portion of layer 20 may be processed to form layer 18. In an alternate embodiment, layer 18 is formed separately from layer 20.

In one embodiment, the SOI wafer 12 may initially include a silicon base layer 20 for the buried amorphized semiconductor layer 18 with an insulating layer (e.g., a buried oxide layer (BOX)) 14 and a silicon-on-oxide layer 16. It should be understood that the substrate 10 may include any suitable material and is not limited to SOI. For example, wafer or substrate 12 can be a SOT or bulk substrate that may include Gallium Arsenide, monocrystalline silicon, Germanium, or any other material or combination of materials where the present principles may be applied. In some embodiments, the substrate 12 further comprises other features or structures that are formed on or in the semiconductor substrate in previous process steps.

The buried amorphized layer 18 is formed under the buried insulator 14 by implanting heavy ions such as Ge, Xe or other elements or combinations thereof with proper dose and energy to minimize damage to the top semiconductor layer 16. Other ion types include but are not limited to Ar, Si, and N. Depending on the implant species, the implant dose can range from $2\times10^{13}/cm^2$ to $8\times10^{15}/cm^2$, the implant energy can range from 0.5 KeV to 100 KeV. It should be noted that portions of the wafer 12 may be selected for protection (e.g., using a patterned mask or the like) during bombardment so that selected regions do not get implanted and amorphized.

An optional photoresist mask or other mask (not shown) may be used to limit the amorphized layer 18 to only regions of the wafer 12 where stress memorization is desired. This could be one of the two device polarities (e.g., for either of NFETs or PFETs or some auxiliary devices or areas of CMOS where it is not desirable for the stress to be present). A stress inducing layer or stressor layer 22, such as e.g., SiN is then deposited and optionally patterned as shown in FIG. 2. The stressor layer 22 includes a thickness determined to provide a desired amount of stress. Specifically, a tensile SiN film may be deposited at low temperature so as not to recrystallize the amorphous Si.

An annealing step is performed to recrystallize the buried amorphous layer 18. During this step, some of the tensile stress is transferred from the stressor layer 22 to the recrystallized layer 18 and memorized including defects 24 and stress regions as shown in FIG. 3. In another embodiment, a compressive film is deposited at a low temperature in the range of 380-550 degrees C. for 30-600 seconds so as not to recrystallize the amorphous Si material during the deposition process. An annealing step is performed during which some of the compressive stress is transferred from the stressed SiN film to the recrystallized Si.

In yet another embodiment, the silicon layer 18 directly under the dielectric layer 14 is amorphized and then a deposition of one film type is performed, e.g., a tensile film. The tensile film is patterned so that it is removed from NFET regions and is left remaining on PFET regions. Next, a compressive film is deposited and patterned to that it is removed from the PFETs and is left remaining on the NFETs. Then, an anneal is performed to memorize the stress from the film (22) into the layer 18, e.g., Si, underneath the dielectric layer 14. Since the effect of the tensile stress in the Si under the dielectric layer 14 is to create compression in the channel of the FETs above it and the effect of the compressive stress in the Si under the dielectric layer 14 is to create tension in the channel of FETs above it. Hole mobility is enhanced for compressive channel stress, and electron mobility is enhanced for tensile channel stress in the case of (100) surface orientated Si wafers with <110> current flow directions. The circuit performance can be significantly improved. CMOS device fabrication is then continued as known in the art.

Figure 4:
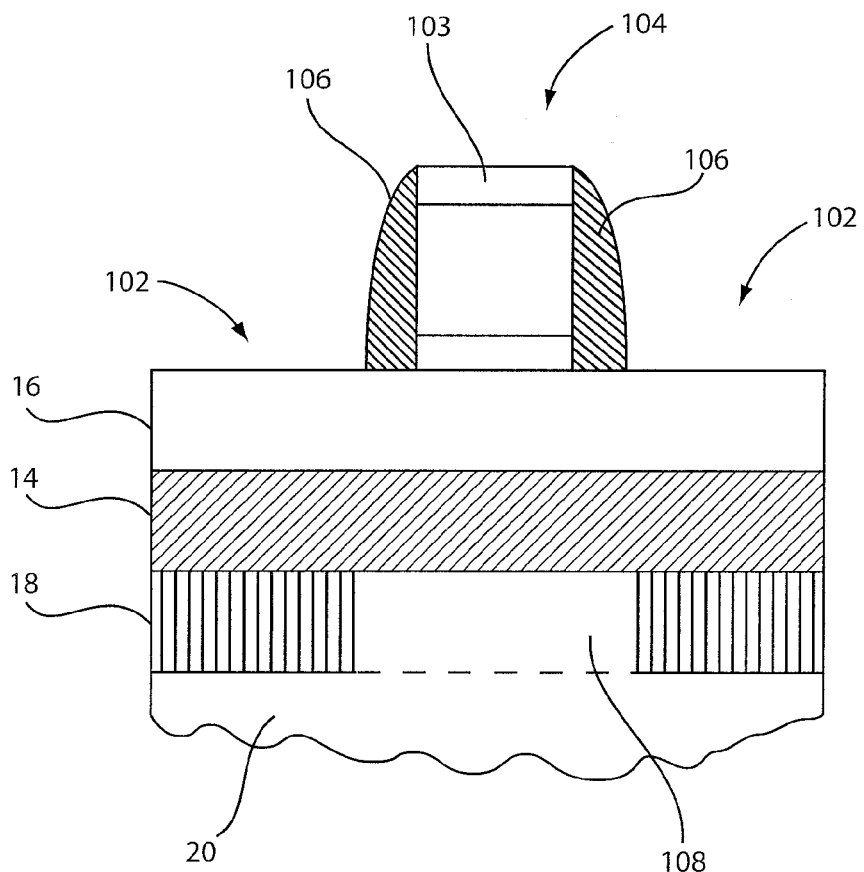
FIG. 4 is a cross-sectional view of a wafer having a thin semiconductor layer, buried dielectric layer, a buried amorphized layer and a gate structure formed thereon in accordance with another embodiment.
Figure 5:
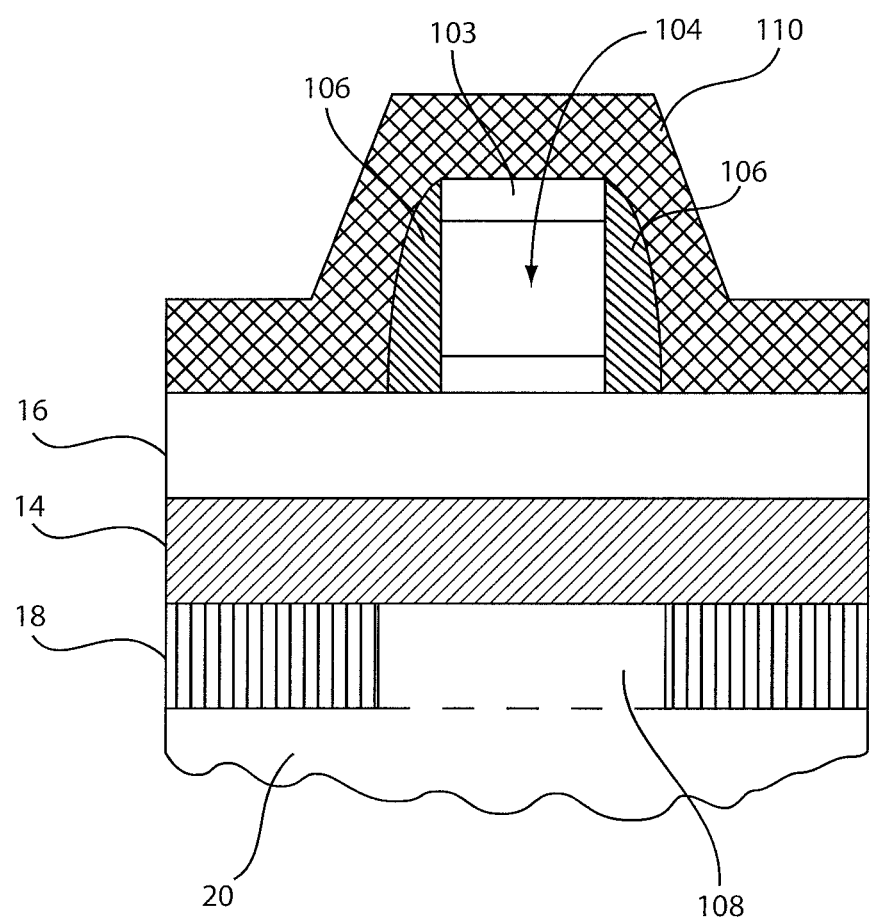
FIG. 5 is a cross-sectional view of the wafer of FIG. 4 having a stress layer or stressor formed in accordance with one embodiment.
Figure 6:
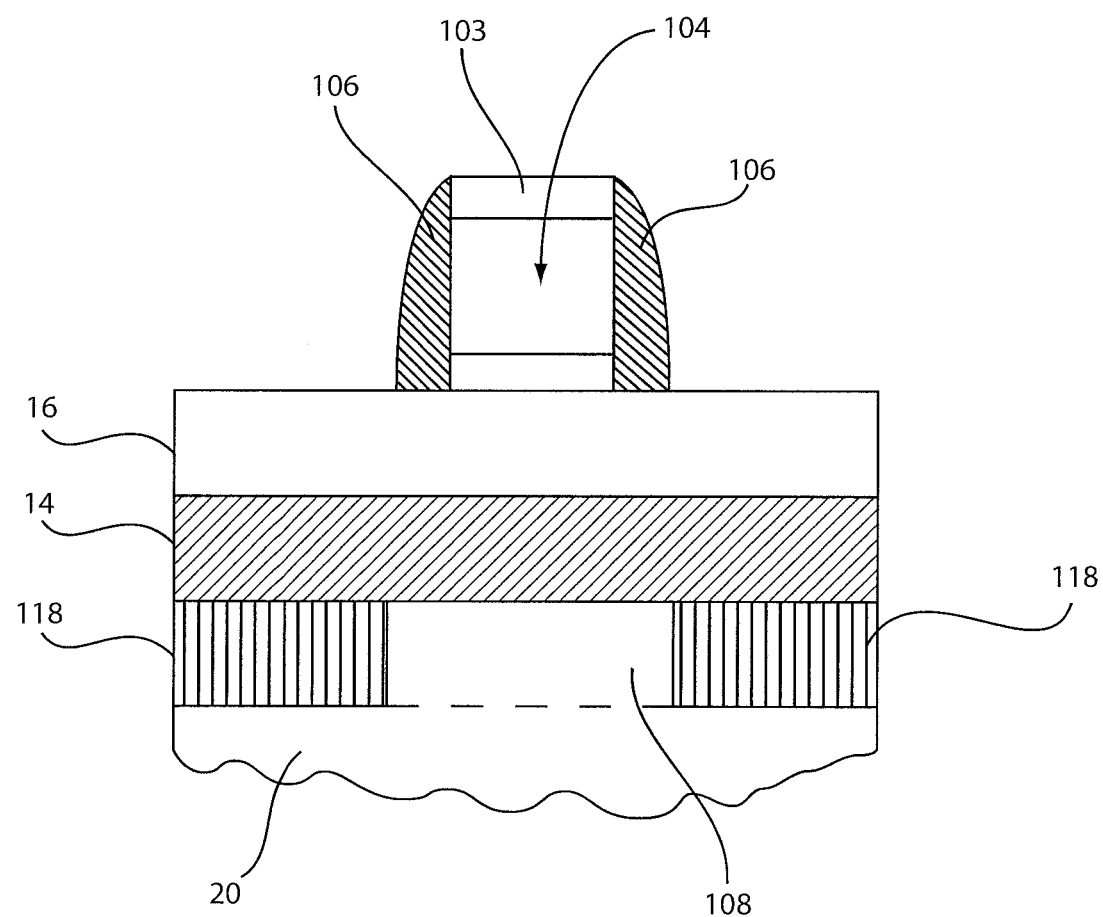
FIG. 6 is a cross-sectional view of the wafer of FIG. 5 after annealing and removing the stress layer in accordance with one embodiment.

FIGS. 4-6 show a stress memorization technique according to another embodiment. Referring to FIG. 4, device fabrication is carried out as known in the art with definition of active regions 102, formation of a gate structure 104, formation of spacers 106 (e.g., SiN) and possible source/drain implants (in layer 16). A buried amorphized layer 18 is formed under the thin buried insulator 14 and in the source/drain regions 102 by implanting heavy ions with proper energy and dose to minimize damage to the top semiconductor layer 16, as described above. It is to be understood that a region 108 below the gate structure 104 is protected from bombardment and is not amorphized by the implantation of ions. Optionally, a hard mask (not shown) can be used on top of the gate structure 104 to prevent implantation in the gate structure 104. Alternately, a gate cap 103, e.g., SiN, may be formed as part of the gate structure 104 and remain as a part thereof, and act as a hard mask to protect the gate structure 104.

Referring to FIG. 5, a stress liner 110 is deposited having properties configured to transfer stress to underlying layers. The liner 110 may optionally be patterned. An annealing step is used to recrystallize the buried amorphous layer 18 and memorize the stress. The annealing step may include a temperature from about 900 to about 1100 degrees C. for a period of about 0 and 5 seconds. The stress liner 110 is removed and the device is processed with optional raised source/drain formation, silicide formation and contacts as may be known in the art. The buried amorphous layer 18 becomes a strained region 118 as shown in FIG. 6.

In another embodiment, the silicon layer 18 directly under the dielectric layer 14 is amorphized and then a deposition of one film type is performed, e.g., a tensile film. The tensile film is patterned so that it is removed from NFET regions and is left remaining on PFET regions. Next, a compressive film is deposited and patterned to that it is removed from the PFETs and is left remaining on the NFETs. Then, the anneal is performed to memorize the stress from the patterned film 110 into the layer 18. The effect of the tensile stress in the layer 18 under the dielectric layer 14 is to create compression in the channel of the FETs above it, and the effect of the compressive stress in the layer 18 under the dielectric layer 14 is to create tension in the channel of FETs above it. Hole mobility is enhanced for compressive channel stress, and electron mobility is enhanced for tensile channel stress in the case of (100) surface orientated Si wafers with <110> current flow directions. The circuit performance can be significantly improved. CMOS device fabrication is then continued as known in the art.

In yet another embodiment, a combination of the embodiment described with reference to FIGS. 1-3 and the embodiment described with reference to FIGS. 4-6 may be employed. Note that the stress application may be employed to enhance circuit performance and in some instances may be used to degrade current flow if this is desirable. For example, this may be the case if a need exists to balance NFETs and PFETs.

In the embodiments described with respect to FIGS. 1-3 and 4-6, stress is transferred to an amorphous semiconductor material and memorized through annealing. The memorized stress provides a strained semiconductor material which strains a channel region of transistor devices formed in the area. The transistor devices with strained channels operate with improved performance. In accordance with the present principles, while annealing reduces some of the stress in the amorphized layer, 80% or more of the stress is preserved.

It should be understood that the amount of stress induced in the channel region can be controlled by controlling process parameters such as anneal time, anneal duration, implantation energy and dose, dimensions, material selection, etc. The device structures may be modeled using computer software, or prototypes may be built and tested to determine process parameters that yield desired results.

Figure 7A:
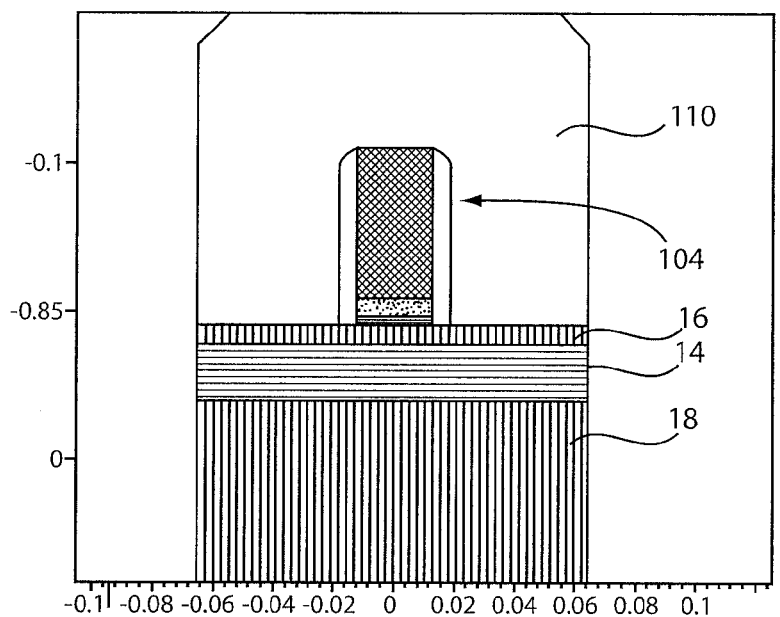
FIG. 7A is an illustrative screen image for a device having a stress liner formed over a gate structure for a computer aided design model.
Figure 7B:
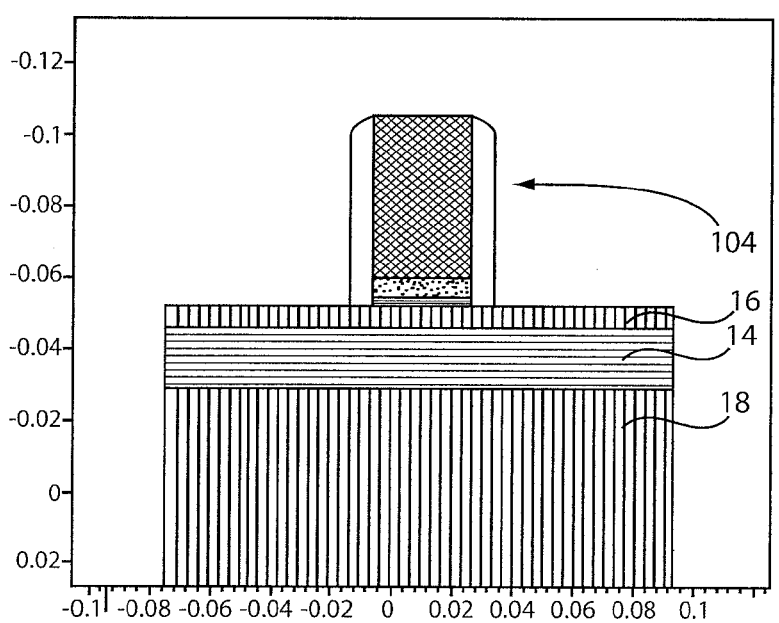
FIG. 7B is an illustrative screen image for a device after an anneal and removal of the stress liner of FIG. 7A for a computer aided design model.

Referring to FIGS. 7A and 7B, a technology computer aided design (TCAD) model was implemented in accordance with the present principles. FIG. 7A shows a gate structure 104 with a stress liner 110 formed thereon. The stress liner 110 had a thickness of 60 nm and 3.5 GPa of compressive stress. A gate length was 25 nm, a buried oxide layer 14 had a thickness of 20 nm. Contacted poly pitch (CPP), which is the distance between gates=130 nm. In the model, the liner 110 is annealed to memorize stress in a silicon substrate 18. As shown in FIG. 7B, the liner 110 is removed and a rapid thermal anneal (RTA) is performed for stress relaxation. The model is then employed to compute memorialized stress induced in a channel of the device below the gate in layer 16.

Figures 8A, 8B:
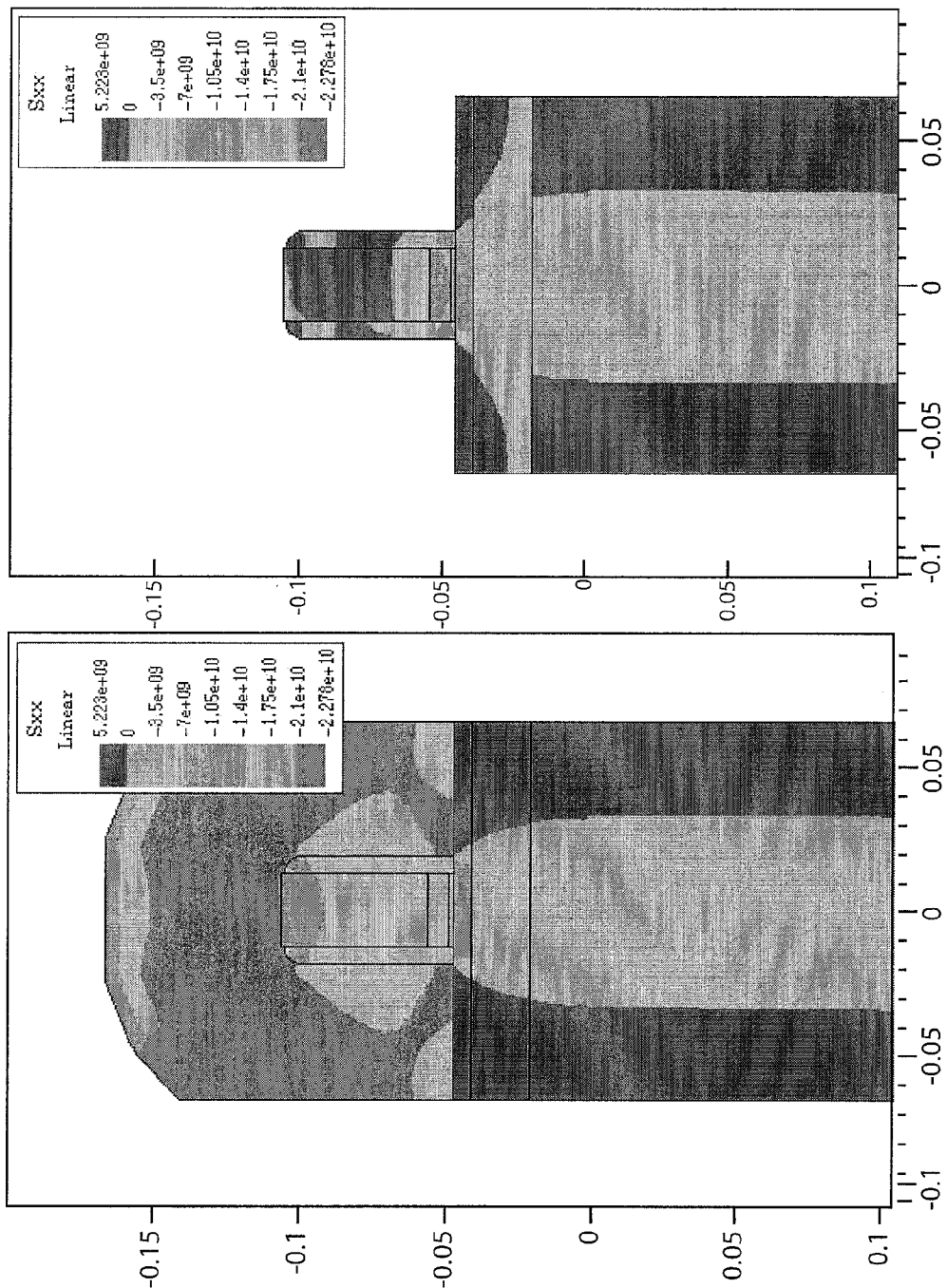
FIG. 8A is an illustrative screen image showing stress contours for a device having a stress liner formed over a gate structure for a computer aided design model as depicted in FIG. 7A.
FIG. 8B is an illustrative screen image showing stress contours for a device after an anneal and removal of the stress liner for a computer aided design model as depicted in FIG. 7B.
Figure 9A:
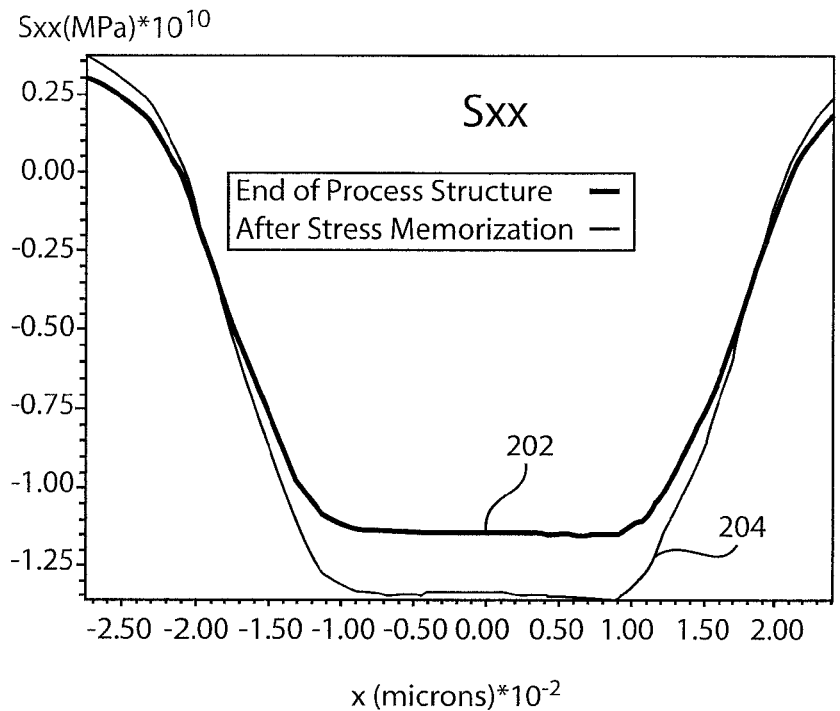
FIGS. 9A, 9B, and 9C show plots of stresses for Sxx, Syy and Szz, respectively corresponding to the stress contours of FIGS. 8A and 8B.
Figure 9B:
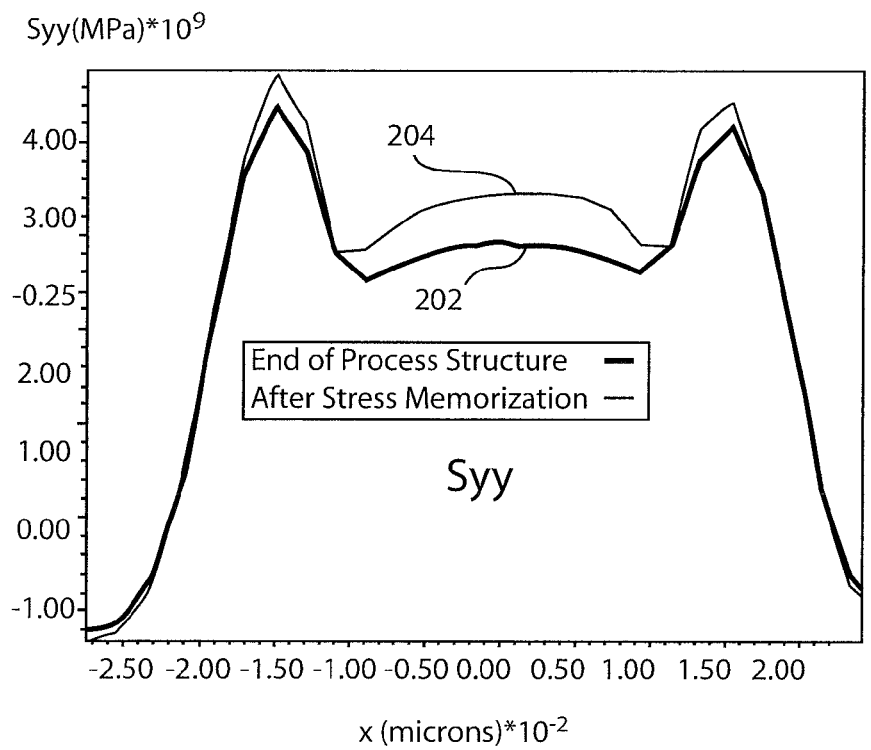
Figure 9C:
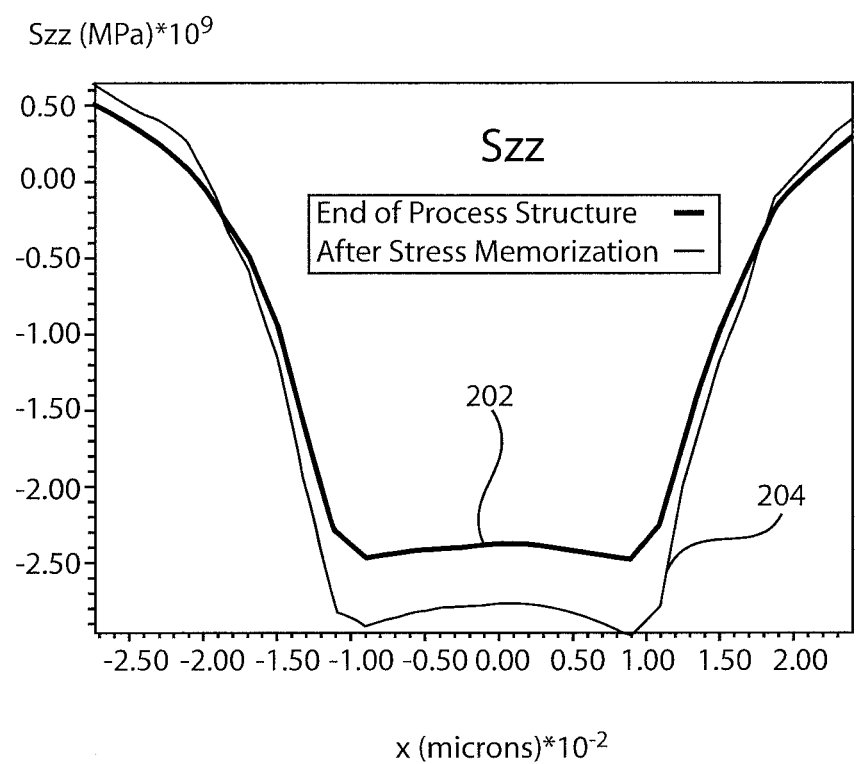

Referring to FIGS. 8A and 8B, stress contours are illustratively depicted for FIGS. 7A and 7B, respectively. The scales on the Y and X axes are in microns. The linear Sxx stresses in the legends are in Pa. Note the stress developed below the gate structure in FIG. 8A is essentially retained after the liner removal and anneal in FIG. 8B. FIGS. 9A, 9B and 9C show the stress levels (Sxx, Syy, Szz) for normal stresses in the x, y and z directions, respectively.

FIGS. 9A, 9B and 9C are plots of stress for the device depicted in FIGS. 7A and 7B. Each FIG. plots an end of process structure stress curve 202 and an after stress memorization curve 204. It can be seen from the plots that the there is an approximate loss of stress level of about 20% between curves 202 and 204. However, 80% or more of the stress is preserved. It should be understood that the illustrative example depicted in FIGS. 7-9 represents an exemplary embodiment. Other parameters and configurations may be employed in accordance with the present principles as well.

The present principles may be employed with thin channel metal oxide semiconductor field effect transistor (MOSFET) structures such as ultrathin body semiconductor-on-insulator (SOD, FinFETs, trigates, etc.

Referring to FIG. 10, a method for inducing stress in a semiconductor layer is illustratively depicted. In block 302, a substrate is provided having a dielectric layer formed between a first semiconductor layer and a second semiconductor layer. In block 304, the second semiconductor layer is processed to form an amorphized material. A layer may be deposited to form the amorphized layer in an alternate embodiment. In block 306, the amorphized layer may be formed by implanting ions in the second semiconductor layer to form the amorphized material. The implanted ions may include at least one of Ge, Si, N, Ar, Xe, etc.

In block 308, a stress layer is deposited on the first semiconductor layer. The stress layer may include a silicon nitride layer. In block 309, the stress in the stress layer may be selected by adjusting deposition parameters to provide a desired stress level, and the stress layer may be patterned, e.g., applying different layers for different regions or devices (NFETs versus PFETs, etc.).

In block 310, the wafer is annealed to memorize stress in the second semiconductor layer by recrystallizing the amorphized material. This may form a device having a channel in the first semiconductor layer, wherein the memorized stress of the second semiconductor layer provides stress in the channel. In block 312, the stress layer is removed. An optional rapid thermal anneal (RTA) may be employed to relax stress after removing the stress liner.

Alternatively, the patterning in block 309 can enable selected transistors to maintain the stress layer during the anneal and transfer stress to the channel while allowing other transistors to have no stressed liner present during the anneal thereby not inducing stress in the channel for other transistors where stress is not wanted. In this way one FET can benefit from the increase in drive current while the other FET will not be degraded. Thus, this technique can be used to form CMOS circuits where the circuit performance is enhanced compared to circuits where this process has not been implemented.

Referring to FIG. 11, another method for inducing stress in a semiconductor layer is illustratively shown. In block 330, a substrate is provided having a dielectric layer formed between a first semiconductor layer and a second semiconductor layer. In block 332, a gate structure for a transistor device is formed on the first semiconductor layer. In block 334, ions are implanted in the second semiconductor layer to form an amorphized material in areas not protected by the gate stack. The ions may include Ge, Xe, Ar, Si, N, etc. In block 336, a stress layer is deposited on the gate structure and the first semiconductor layer. The stress layer may include a silicon nitride layer. In block 338, the stress layer may be patterned to select regions where stress is applied or different stresses are applied. In block 339, deposition parameters may be adjusted to adjust a stress provided by the stress layer. In block 340, the wafer is annealed to memorize stress in the second semiconductor layer by recrystallizing the amorphized material. In block 342, the stress layer is removed. An optional rapid thermal anneal may be employed to relax stress after removing the stress liner.

The methods described in FIGS. 10 and 11 can be combined to facilitate performance enhancement. In one instance, PFETs and NFETs in a circuit or microprocessor can have stress layers patterned to provide different stress levels for different devices or regions (with or without gate structures). The patterning may be employed to eliminate stress, or provide a different stress for one FET type as opposed to the other. In this way, a circuit may include one FET stressed for drive current enhancement while the other FET is not stressed so that it is not degraded, e.g., hole mobility is enhanced with longitudinal compressive stress in the channel and electron mobility is enhanced for longitudinal tension in the channel.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for inducing stress in a semiconductor layer, comprising:
forming a substrate structure, the substrate structure comprising a semiconductor base layer, a buried dielectric layer formed on the semiconductor base layer, and a semiconductor channel layer formed on the buried dielectric layer;
ion implanting a dopant through an uppermost surface of the semiconductor channel layer and the buried dielectric layer into the semiconductor base layer to form an amorphized material region only in a portion of the semiconductor base layer that is in direct contact with the buried dielectric layer;
depositing a stress layer after the amorphized region is formed, wherein the stress layer is directly on a surface of the semiconductor channel layer that is opposite a surface of the semiconductor channel layer that is in direct contact with the buried dielectric layer;
annealing the substrate structure to memorize stress in a portion of the semiconductor base layer that is in direct contact with the buried dielectric layer by recrystallizing the amorphized material, wherein the memorized stress of the semiconductor base layer induces stress in the semiconductor channel layer;
removing the stress layer; and
forming a gate structure after removing the stress layer, wherein the gate structure is formed on the surface of the semiconductor channel layer that is opposite the surface of the semiconductor channel layer that is in direct contact with the buried dielectric layer, and wherein the gate structure includes an electrode layer and a gate dielectric layer that are separate layers from the substrate structure.

2. The method as recited in claim 1, further comprising forming a device having a channel in the semiconductor channel layer.

3. The method as recited in claim 1, wherein implanting ions includes implanting at least one of Ge, Si, Ar, N and Xe.

4. The method as recited in claim 1, wherein depositing a stress layer includes depositing a silicon nitride layer.

5. The method as recited in claim 1, wherein depositing a stress layer includes adjusting deposition parameters to adjust a stress provided by the stress layer.

6. The method as recited in claim 1, wherein depositing a stress layer includes patterning the stress layer.

7. The method as recited in claim 6, wherein patterning the stress layer includes applying the stress layer in first regions while eliminating the stress layer from second regions.

8. The method as recited in claim 7, wherein the stress layer in first regions applies stress to enhance drive current and the second regions are not stressed.

9. The method as recited in claim 6, wherein patterning the stress layer includes applying a first stress layer in first regions and a second stress layer in second regions.

10. The method as recited in claim 9, wherein the first stress layer provides a first stress in the first regions and the second stress layer provides a second stress in the second regions.

11. The method as recited in claim 1, wherein the semiconductor base layer is provided for an entire surface of the substrate structure.

12. A method for inducing stress in a semiconductor layer, comprising:
forming a substrate structure, the substrate structure comprising a semiconductor base layer, a buried dielectric layer formed on the semiconductor base layer, and a semiconductor channel layer formed on the buried dielectric layer;
forming a gate structure for a transistor device on the semiconductor channel layer, the semiconductor channel layer including a channel region;
implanting ions selected from the group consisting of Ar, N, Xe and a combination thereof through an uppermost surface of the semiconductor channel layer and the buried dielectric layer into the semiconductor base layer to form an amorphized material only in areas of the semiconductor base layer not protected by the gate structure, wherein a sidewall of the gate structure is aligned with an inner edge of the amorphized material;
depositing a stress layer on the gate structure and the semiconductor channel layer; and annealing the substrate structure to memorize stress in the semiconductor base layer by recrystallizing the amorphized material to impart stress from a direction opposite a side of the semiconductor channel layer including the channel region.

13. The method as recited in claim 12, wherein the transistor device has a channel in the semiconductor channel layer such that the memorized stress of the semiconductor base layer provides stress in the channel.

14. The method as recited in claim 12, wherein depositing a stress layer includes depositing a silicon nitride layer.

15. The method as recited in claim 12, wherein depositing a stress layer includes adjusting deposition parameters to adjust a stress provided by the stress layer.

16. The method as recited in claim 12, wherein depositing a stress layer includes patterning the stress layer.

17. The method as recited in claim 16, wherein patterning the stress layer includes applying the stress layer in first regions while eliminating the stress layer from second regions.

18. The method as recited in claim 17, wherein the stress layer in first regions applies stress to enhance drive current and the second regions are not stressed.

19. The method as recited in claim 16, wherein patterning the stress layer includes applying a first stress layer in first regions and a second stress layer in second regions.

20. The method as recited in claim 19, wherein the first stress layer provides a first stress in the first regions and the second stress layer provides a second stress in the second regions.

21. The method as recited in claim 12, wherein the semiconductor base layer is provided for an entire surface of the substrate structure.

\* \* \* \* \*